United States Patent [19]

Gardner, Jr.

[11] 3,907,731

[45] Sept. 23, 1975

[54] AMINE CURABLE POLYEPOXIDE COMPOSITIONS

[75] Inventor: Ross Gardner, Jr., Stoughton, Mass.

[73] Assignee: Cabot Corporation, Boston, Mass.

[22] Filed: Mar. 5, 1973

[21] Appl. No.: 338,067

[52] U.S. Cl.. 260/18 PF; 260/30.8 R; 260/33.2 EP; 260/33.4 EP; 260/830 TW

[51] Int. Cl.[2] .................... C08K 5/10; C08L 63/00; C09L 91/00

[58] Field of Search .......... 260/18 R, 18 EP, 18 PF, 260/830 R, 830 TW, 33.2 EP, 33.4 EP

[56] References Cited

UNITED STATES PATENTS

| | | | |
|---|---|---|---|
| 2,653,139 | 9/1953 | Sterling | 260/2.5 F |
| 3,356,624 | 12/1967 | Neal et al. | 260/830 TW |
| 3,635,875 | 1/1972 | Reither | 260/830 TW |

*Primary Examiner*—Murray Tillman
*Assistant Examiner*—J. Ziegler
*Attorney, Agent, or Firm*—Kenneth W. Brown; Barry R. Blaker; Lawrence A. Chaletsky

[57] ABSTRACT

Amine curable epoxy potting compositions are disclosed which, in the cured state, have excellent impact or vibration absorbing properties and which are sufficiently friable as to be readily mechanically removed from a component potted therewith. The curable compositions of the invention comprise two particular genera of epoxy resins and a particular genus of surfactant modifier.

9 Claims, No Drawings

AMINE CURABLE POLYEPOXIDE COMPOSITIONS

BACKGROUND OF THE INVENTION

The art of encapsulating or "potting" various components, particularly electronic components, in a cured epoxy composition has been extensively developed. Conventionally, electronic components susceptible of impact or vibration damage such as transistors, junction diodes, microminiature circuitry, computer amplifiers, memory cores, transformers and the like are placed in a mold which may also form the exterior shell of the finished item. With the electrical contacts suitably exposed, the remainder of the component or subassembly is covered with an initiated liquid epoxy resin which subsequently cures to a solid form. While in some instances external heat can be applied to hasten the cure it is generally desirable and sometimes necessary that as little heat be developed as possible in order not to injure a heat sensitive component. Thus, the characteristics of a low order exotherm on curing is often a highly desirable feature of certain epoxy potting compositions. In any case, on curing, the potted component is physically protected by the hardened epoxy resin. In prior art potting compositions the cured epoxy product is generally extremely hard and tenacious. Thus, the cured resin cannot normally be removed from the potted component such as for purposes of servicing or inspection thereof. Thus, it is a common occurrence that many failed epoxy potted components could be returned to useful service if only it were possible to remove the cured epoxy resin composition from the component without damage thereto and thus gain the necessary access for purposes of inspection, testing and repair. In accordance with the present invention, this desirable feature has been rendered available.

OBJECTS OF THE INVENTION

It is a principal object of the invention to provide novel amine curable epoxy resin compositions.

It is another object of the invention to provide novel epoxy resin compositions which, when cured, have excellent vibration and impact energy absorption characteristics.

It is yet another object to provide novel epoxy resin compositions which, when cured, are of a friable nature, and can be mechanically removed from components potted therewith.

It is still another object of the invention to provide novel amine curable epoxy resin potting compositions which cure with mild exotherms.

Other objects and advantages of the invention will in part appear hereinafter and will in part be obvious.

GENERAL DESCRIPTION OF THE INVENTION

In accordance with the present invention the above and other objects and advantages are served by the provision of amine curable epoxy resin compositions comprising:

A. between 26 and 40 parts by weight of a polyepoxide consisting essentially of a product of reaction between a dihydric phenol and an epihalohydrin;

B. between 54 and 80 parts by weight of a flexibilized polyepoxide containing an internal, reactive plasticizer;

C. between 46 to 70 parts by weight of an alkylphenol/ethylene oxide reaction product.

DETAILED DESCRIPTION OF THE INVENTION

Each of the epoxide resin genera embodied in the compositions of the invention have melting points which are less than about 50°C, although the preferred polyepoxide materials are liquid at room temperature, i.e., 20° to 35°C.

The polyepoxides of the group (A) genus consist essentially of products of the reaction effected between a dihydric phenol and an epihalohydrin. Generally speaking, said reaction is carried out in an alkaline medium with an excess of the epihalohydrin. Representative dihydric phenols are the polynuclear phenols such as 2,2-bis(4-hydroxyphenyl)propane, 2,2-bis(4-hydroxyphenyl)butane, 4,4'-dihydroxybenzophenone, bis(4-hydroxyphenyl)ethane, 1-5-dihydroxynaphthalene, 2,2-bis(4-hydroxy-2-methylphenyl)propane, 2,2-bis(4-hydroxy-2-tertiarybutylphenyl) propane, bis(2-hydroxynaphthyl)methane and the like and the mononuclear phenols such as resorcinol, catechol, hydroquinone, etc. Additionally, the genus (A) polyepoxide will have a weight per epoxide value of between about 175 and about 280. Said weight per epoxide value, hereinafter referred to as the "W.P.E." value, is defined as the average equivalent weight of polyepoxide per epoxide group forming part of the polymer molecule. The W.P.E. value can be determined by heating a weighed sample of a polyepoxide of known average molecular weight with an excess of pyridinium chloride dissolved in chloroform or pyridine so as to convert all epoxide groups to chlorohydrin groups by hydrochlorination. The excess pyridinium chloride is then backtitrated with 0.1 N NaOH in methanol to the phenolphthalein end point. The W.P.E. value is then calculated by taking into account that each HCl group removed as a result of the hydrochlorination reaction is equivalent to one epoxide group.

The preferred amounts of the group (A) polyepoxide employed in the compositions of the invention will range from 29 to 37 parts by weight and most preferably will be 33 parts by weight.

The polyepoxides of interest with respect to the genus (B) portion of the compositions of the invention are generally those dihydric phenol/epihalohydrin polyepoxides which have been rendered flexible upon curing by the addition thereto of between 15 to 30 percent by weight thereof of one or more internal reactive plasticizers and which polyepoxides have W.P.E. values of between about 325 and about 750 and preferably between 350 and 550. Upon curing, said plasticizers enter into the formation of the solid polyepoxide molecules and are thus quite distinct and divorced from external plasticizers or diluents which chemically remain unbonded to the epoxide molecules upon curing. Thus, the internal plasticizers are generally flexible, long chain molecules which are covalently linked to the polymer network during curing. In general, the flexible polyepoxides of commerce comprise polyglycol diepoxides or epoxidized dimer or trimer fatty acids as the flexibilizing internal plasticizer, although various liquid polysulfide rubbers capable of linking two diepoxide molecules together can also be employed. As an example of the latter, a suitable polysulfide internal plasticizer is represented by the formula:

$$HS-(C_2H_4-O-C_2H_4-O-C_2H_4-S-S)_6-C_2H_4-O-C_2H_4SH$$

However, the preferred internal plasticizers employed in the flexible polyepoxide of genus (B) of the present invention are the polyglycol diepoxides or ester type epoxides derived from dimerized or trimerized fatty acids. In preferred embodiments of the compositions of the invention, the amount of the genus (B) polyepoxides will be between about 60 and about 74 parts by weight. Further details relating to internally plasticized, flexible opoxy resins can be had by reference to the following literature: *Epoxy Resin Technology*, Paul F. Bruins, Interscience Publishers, 1968; *Epoxy Resins*, Irving Skeist, Reinhold Publishing Corp., 1958; *Epoxide Resins*, W. G. Potter, Springer-Verlag New York Inc., 1970.

Other pertinent literature relating to epoxy resins in general and their characteristics is to be found at pages 312–329 of *The Encyclopedia of Chemical Technology*, First Supplement Volume, by Kirk and Othmer, The Interscience Encyclopedia Inc., New York, N.Y., 1957. A more detailed presentation is found in the book, *Epoxy Resins. Their Application and Technology*, Lee and Neville, McGraw-Hill Book Co., Inc., 1957.

The ethylene oxide condensation products of alkylphenols useful in the compositions of the present invention are essentially water insoluble. Examples of suitable starting material phenols are: octylphenol, nonylphenol, dodecylphenol, dihexylphenol, dioctylphenol, tridecylphenol, dinonylphenol, cyclohexylphenol and the like. Preferred, however, are those alkylphenols wherein each alkyl group has 9 or less carbon atoms. Where monalkyl phenols are the starting materials it is preferred that the alkyl radicals be located at the para position. Where di and tri-alkylphenols are employed it is preferred that the alkyl radicals be located at the ortho and para positions.

It is important that the ethylene oxide adduct of the alkylphenol have an average mole ratio of no greater than 4 and preferably less than 3. Said mole ratio represents the average number of moles of ethylene oxide adduct per mole of the alkylphenol. At ethylene oxide mode ratios of greater than 4 excessive water solubility normally results. A general formula for the ethoxylated alkylphenol condensation products of the invention is as follows:

$$R-\underset{R}{\overset{R}{\phi}}-O-O(CH_2CH_2O)_{n-1}CH_2CH_2OH$$

wherein each R is any alkyl or hydrogen radical and at least one of which radicals is an alkyl; $\phi$ is an aromatic ring and $n$ is an integer from 1 to 4 representative of the total number of moles of ethylene oxide used in the formation of the condensation product. Such ethoxylated alkylphenol condensation products are currently widely employed as non-ionic surfactants in various applications such as foam control, defoaming, emulsification, petroleum oil detergency, vinyl resin plasticizing petroleum oil corrosion inhibiting, fuel deicing and the like.

As mentioned hereinbefore, the compositions of the invention will comprise between 47 and 70 parts by weight of the alkylphenol/ethylene oxide condensation reaction product. In a preferred embodiment of my invention, however, the epoxy potting composition will comprise between 52 and 65 parts by weight of said condensation reaction product.

There follows a non-limiting Example:

EXAMPLE

There are formulated the following two-part compositions:

| Material | Parts by Weight |
|---|---|
| **PART A** | |
| Araldite 6020, a liquid bisphenol-A/epichlorohydrin polyepoxide having a W.P.E. value of 196-208 and produced by CIBA-GEIGY Corp. | 33.0 |
| Araldite 508, a liquid bisphenol-A/epichlorohydrin flexibilized polyepoxide having a W.P.E. value of 400-455 and containing between about 15 and 30 weight percent of said bisphenol-A/epichlorohydrin epoxide of a polyglycol diepoxide plasticizer (CIBA-GEIGY Corp.) | 67.0 |
| **PART B** | |
| Igepal CO-210, a water insoluble ethylene oxide condensation adduct of p-nonylphenol having an average ethylene oxide mole ratio of 1.5 produced by General Aniline and Film. | 58.6 |
| D.E.T.A. (diethylenetriamine) | 7.0 |

In the mixing of the materials of PART B, above, it is noted that an exotherm takes place. Said exotherm is suggestive of the fact that a coordination reaction takes place between the ethylene oxide/nonylphenol reaction product and the D.E.T.A. Moreover, over a substantial range of temperatures, the vapor pressures of D.E.T.A. occurring over the composition of PART B are determined to be substantially lower than those over D.E.T.A., taken alone. Accordingly, the use of the combination of materials of PART B is considered highly advantageous in formulating the initiated compositions of the invention since the resulting depression in D.E.T.A. vapor pressure renders the combination safer to handle than would be the case were the D.E.T.A. to be employed separately.

In any case, final compounding and curing of the composition of the invention is achieved by mixing of PART A with PART B. The thusly initiated composition is found to be an effective potting composition. In curing, the composition undergoes a low order exotherm deemed acceptably mild for the potting of thermally sensitive electronic components therewith. Further, the cured epoxy composition is of a friable, rubber-like nature similar to that of a conventional art gum eraser and can be mechanically removed from a potted item without undue difficulty. The hardness of the cured composition is tested by the ASTM D-2240-68 Shore Durometer A method (5 second recordings) and is found to be 36. Impact resilience, another measure of the impact energy absorption character of a material, is determined at various temperatures of the composition in accordance with a modification of the ASTM D-2632-67 method. For comparative purposes, the cured test composition of the invention is tested against a standard consisting of a similar dual epoxide cured composition which is formulated without the ethoxylated alkylphenol condensation product. In general, the lower the impact resilience the greater the impact energy absorption character of the composition.

| Composition | 3° | 18° | 27° |
|---|---|---|---|
| | Temperature (°C) | | |
| | Rebound (inches) | | |
| Invention | 3-3/4 | 1-7/8 | 4-1/4 |
| Standard | 25 | 15-3/4 | 12-1/16 |

From the above it is obvious that the compositions of the present invention have much improved impact energy absorption characteristics over the standard composition which is similar except for the lack therein of the ethoxylated alkylphenol condensation product.

While this invention has been described hereinbefore with respect to certain embodiments thereof, it is not so limited, and it should be understood that variations and modifications thereof may be made which are obvious to those skilled in the art without departing from the spirit or scope of the invention. For instance, the epoxy potting compositions of the invention can contain fillers and pigments such as carbon black, silica, calcium carbonate, titania or vanadia; flame retardants such as antimony trioxide; colorants; anti-oxidants; anti-ozonants; curing agents; accelerators; retarders and the like.

Having thus described the invention, what is claimed as new and desired to be secured by Letters Patent is:

1. An epoxy potting composition comprising:

A. between about 26 and about 40 parts by weight of a dihydric phenol/epihalohydrin polyepoxide having a melting point of less than about 50°C and a W.P.E. value of between about 175 and about 280;

B. between about 54 and about 80 parts by weight of a flexibilized polyepoxide composition having a melting point of below about 50°C and a W.P.E. value of between about 325 and about 750, said polyepoxide composition comprising a dihydric phenol/epihalohydrin polyepoxide containing between about 15 and about 30 percent by weight thereof of an internal reactive plasticizer;

C. between about 46 and about 70 parts by weight of an essentially water insoluble alkylphenol/ethylene oxide reaction product conforming to the general formula $$R-\underset{\substack{|\\R}}{\overset{\substack{R\\|}}{\phi}}-O-O(CH_2CH_2O)_{n-1}CH_2CH_2OH$$

wherein each R is any alkyl or hydrogen radical and at least one of which radicals is an alkyl; $\phi$ is an aromatic ring and $n$ is an integer of from 1 to 4; and D. an amine curing agent in an amount sufficient to effectuate curing of the composition.

2. The composition of claim 1 wherein the amount of (A) is between 29 and 37 parts by weight; the amount of (B) is between 60 and 74 parts by weight; and the amount of (C) is between 52 and 65 parts by weight.

3. The composition of claim 1 wherein the polyepoxide of (A) is a product of reaction of bisphenol-A and epichlorohydrin.

4. The composition of claim 1 wherein the polyepoxide of (B) has a W.P.E. value of between 350 and 550.

5. The composition of claim 1 wherein the internal reactive plasticizer of the polyepoxide of (B) is a polyglycol diepoxide.

6. The composition of claim 1 wherein the internal reactive plasticizer of the polyepoxide of (B) is an ester type epoxide of a dimerized or trimerized fatty acid.

7. The composition of claim 1 wherein (C) is a reaction product of p-nonylphenol and ethylene oxide.

8. The composition of claim 1 wherein, in (C), each alkyl group in the formula $$R-\underset{\substack{|\\R}}{\overset{\substack{R\\|}}{\phi}}-O-O(CH_2CH_2O)_{n-1}CH_2CH_2OH$$

comprises a maximum of nine carbon atoms.

9. The composition of claim 1 wherein each of the polyepoxides of (A) and (B) is a liquid at 20°C.

* * * * *